(12) United States Patent
Nakatsuji et al.

(10) Patent No.: US 11,881,400 B2
(45) Date of Patent: *Jan. 23, 2024

(54) SILICON-CONTAINING LAYER-FORMING COMPOSITION, AND METHOD FOR PRODUCING PATTERN-EQUIPPED SUBSTRATE WHICH USES SAME

(71) Applicant: Central Glass Company, Limited, Ube (JP)

(72) Inventors: Junya Nakatsuji, Fujimino (JP); Kazuhiro Yamanaka, Tachikawa (JP)

(73) Assignee: Central Glass Company, Limited, Ube (JP)

( * ) Notice: Subject to any disclaimer, the term of this patent is extended or adjusted under 35 U.S.C. 154(b) by 0 days.

This patent is subject to a terminal disclaimer.

(21) Appl. No.: 17/873,304

(22) Filed: Jul. 26, 2022

(65) Prior Publication Data

US 2022/0384182 A1 Dec. 1, 2022

Related U.S. Application Data

(63) Continuation of application No. 16/970,298, filed as application No. PCT/JP2019/006430 on Feb. 21, 2019, now Pat. No. 11,437,237.

(30) Foreign Application Priority Data

Feb. 28, 2018 (JP) ................... 2018-035469

(51) Int. Cl.
| | | |
|---|---|---|
| H01L 21/027 | (2006.01) | |
| H01L 21/311 | (2006.01) | |
| C08G 77/24 | (2006.01) | |
| G03F 7/09 | (2006.01) | |
| G03F 7/11 | (2006.01) | |

(52) U.S. Cl.
CPC .......... *H01L 21/0276* (2013.01); *C08G 77/24* (2013.01); *G03F 7/094* (2013.01); *G03F 7/11* (2013.01); *H01L 21/31138* (2013.01); *H01L 21/0275* (2013.01)

(58) Field of Classification Search
None
See application file for complete search history.

(56) References Cited

U.S. PATENT DOCUMENTS

| | | |
|---|---|---|
| 3,008,975 A | 11/1961 | Schubert |
| 5,632,910 A | 5/1997 | Nagayama et al. |
| 2004/0248032 A1 | 12/2004 | Zampini et al. |
| 2009/0092930 A1 | 4/2009 | Endo et al. |
| 2012/0052439 A1 | 3/2012 | Wu |
| 2012/0052685 A1 | 3/2012 | Ogihara et al. |
| 2012/0178022 A1 | 7/2012 | Kamogawa |
| 2012/0237873 A1 | 9/2012 | Fujiwara |
| 2015/0072275 A1 | 3/2015 | Liu |
| 2016/0266491 A1 | 9/2016 | Seino et al. |
| 2016/0370703 A1 | 12/2016 | Uchida |
| 2017/0003595 A1* | 1/2017 | Aoki ............. G03F 7/0752 |
| 2017/0271151 A1* | 9/2017 | Yaguchi ............ G03F 7/38 |
| 2017/0285477 A1 | 10/2017 | Tanigaki |

FOREIGN PATENT DOCUMENTS

| | | |
|---|---|---|
| JP | 4-130324 A | 5/1992 |
| JP | 7-181688 A | 7/1995 |
| JP | 7-183194 A | 7/1995 |
| JP | 2002-55456 A | 2/2002 |
| JP | 2004-256503 A | 9/2004 |

(Continued)

OTHER PUBLICATIONS

U.S. Office Action issued in U.S. Appl. No. 16/970,286 dated Nov. 25, 2022 (12 pages).
International Search Report (PCT/ISA/210) issued in PCT Application No. PCT/JP2019/006430 dated May 14, 2019 with English translation (three (3) pages).
Japanese-language Written Opinion (PCT/ISA/237) issued in PCT Application No. PCT/JP 2019/006430 dated May 14, 2019 (four (4) pages).
International Search Report (PCT/ISA/210) issued in PCT Application No. PCT/JP2019/006429 dated Apr. 16, 2019 with English translation (four (4) pages).

(Continued)

*Primary Examiner* — Shamim Ahmed
(74) *Attorney, Agent, or Firm* — Crowell & Moring LLP

(57) ABSTRACT

Provided is a silicon-containing layer forming composition for forming a silicon-containing layer which exhibits an anti-reflective function during exposure in a multilayer resist process and, during dry etching, shows a high etching rate against a plasma of fluorine-based gas and a low etching rate against a plasma of oxygen-based gas. The silicon-containing layer forming composition includes a polysiloxane compound having a structural unit of the formula: $[(R^1)_b R^2_m SiO_{n/2}]$ and a solvent. In the formula, $R^1$ is a group represented by the following formula:

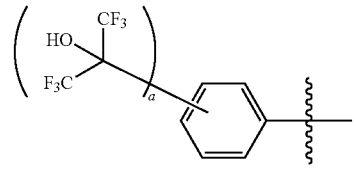

(where a is an integer of 1 to 5; and a wavy line means that a line which the wavy line intersects is a bond); $R^2$ is each independently a hydrogen atom, a $C_1$-$C_3$ alkyl group, a phenyl group, a hydroxy group, a $C_1$-$C_3$ alkoxy group or a $C_1$-$C_3$ fluoroalkyl group; b is an integer of 1 to 3; m is an integer of 0 to 2; n is an integer of 1 to 3; and a relationship of b+m+n=4 is satisfied.

8 Claims, No Drawings

(56) References Cited

FOREIGN PATENT DOCUMENTS

| JP | 2005-15779 A | 1/2005 |
|---|---|---|
| JP | 2009-94146 A | 4/2009 |
| JP | 2009-286980 A | 12/2009 |
| JP | 2012-53253 A | 3/2012 |
| JP | 2012-208350 A | 10/2012 |
| JP | 2014-156461 A | 8/2014 |
| JP | 2015-129908 A | 7/2015 |
| KR | 10-2011-0106829 A | 9/2011 |

OTHER PUBLICATIONS

Japanese-language Written Opinion (PCT/ISA/237) issued in PCT Application No. PCT/JP2019/006429 dated Apr. 16, 2019 (three (3) pages).

Farah et al., "Perhalo Ketons. V. The Reaction of Perhaloacetones with Aromatic Hydocarbons", Journal of Synthetic Organic Chemistry, Apr. 1965, pp. 998-1001, vol. 30, (four (4) pages).

Yamanoi et al., "Efficient Synthesis of Arylsilanes by Cross-Coupling of Aromatic Compounds with Hydrosilanes as Silicon Sources", Journal of Synthetic Organic Chemistry, 2009, pp. 778-786, vol. 67, No. 8, with English abstract (nine (9) pages).

Ito, "Silicone Handbook", Nikkan Kogyo Shinbunsha, Aug. 31, 1998, pp. 104-105, with English abstract (two (2) pages).

Unno et al., "Pentacyclic Laddersiloxane", Journal of American Chemical Society, Feb. 20, 2002, vol. 124, No. 8, pp. 1574-1575, (two (2) pages).

Braun, "Addition of Hexafluoroacetone to Alkoxysilanes", Inorganic Chemistry, Oct. 1966, vol. 5, No. 10, p. 1831-1832, (two (2) pages).

Houser et al., "Rational Materials Design of Sorbent Coatings for Explosives: Applications with Chemical Senors", Talanta, 2001, vol. 54, pp. 469-485 (17 pages).

United States Non-Final Office Action issued in U.S. Appl. No. 16/970,298 dated Dec. 13, 2021 (10 pages).

Korean-language Office Action issued in Korean Application No. 10-2020-7027680 dated Jan. 25, 2022 with English translation (10 pages).

United States Non-Final Office Action issued in U.S. Appl. No. 16/970,286 dated Apr. 26, 2023 (8 pages).

\* cited by examiner

SILICON-CONTAINING LAYER-FORMING COMPOSITION, AND METHOD FOR PRODUCING PATTERN-EQUIPPED SUBSTRATE WHICH USES SAME

CROSS REFERENCE TO RELATED APPLICATIONS

This application is a continuation of U.S. patent application Ser. No. 16/970,298, filed Aug. 14, 2020, now U.S. Pat. No. 11,437,237, which is a 371 of International Application No. PCT/JP2019/006430, filed Feb. 21, 2019, which claims priority to Japanese Patent Application No. 2018-035469, filed Feb. 28, 2018, the disclosures of all of which are expressly incorporated by reference herein.

FIELD OF THE INVENTION

The present invention relates to a silicon-containing layer forming composition applicable as an intermediate layer of a multilayer film in a multilayer resist process, which is usable for fine processing during semiconductor manufacturing, and to a method of producing a patterned substrate with the use of the silicon-containing layer forming composition.

BACKGROUND ART

The high integration and fine patterning of LSI (Large Scale Integration) circuits are being pursued. The high integration and fine patterning of the LSI circuits have been pursued with the use of shorter-wavelength light sources in lithography and the development of resists applicable to such shorter-wavelength lithography. In the manufacturing of a LSI circuit, it is common to produce a patterned substrate by forming a resist pattern on a substrate by light exposure and development according to lithography, dry-etching the substrate with a chlorine-based gas or fluorine-based gas through the resist pattern and thereby allowing pattern transfer to the substrate. As the material for the resist pattern, used is a resin having a chemical structure resistant to etching by these gases.

There are known two kinds of the resist: one is a positive resist whose part exposed to a high energy ray becomes soluble; and the other is a negative resist whose part exposed to a high energy ray becomes insoluble. Either the positive resist or the negative resist is used. As the high energy ray for exposure of the resist, there can be used a g-ray (of 463 nm wavelength) or i-ray (of 365 nm wavelength) from a high-pressure mercury lamp, a ultraviolet ray of 248 nm wavelength from a KrF excimer laser or of 193 nm wavelength from an ArF excimer laser or an extreme ultraviolet ray (hereinafter also referred to as "EUV").

The manufacturing of a semiconductor device includes, after forming a resist pattern on a substrate, dry-etching the substrate through the resist pattern. In this etching step, the etching conditions such as etching time are adjusted according to the thickness of the resist.

When the resist pattern has a small pattern width and a high aspect ratio, however, the pattern may collapse during a development step using an alkaline developer or its subsequent aqueous washing and drying step in the lithography as described in Patent Document 1. Further, the pattern may collapse when the etching time becomes long. In addition, there is a limit in improving the etching resistance of the resist.

Patent Document 1 describes a multilayer resist process as means for solving such a pattern collapse problem. The multilayer resist process includes forming on a substrate a multilayer film having an upper layer of resist, an intermediate layer and a lower layer and forming a pattern on the substrate by light exposure, development and dry etching. More specifically, the multilayer resist process goes through the following multiple steps. The upper layer of resist (hereinafter also referred to as "resist layer") is exposed to light through a pattern mask and developed with an alkaline aqueous solution, thereby forming a resist pattern. A part of the intermediate layer exposed through the resist mask is dry-etched so that a pattern is formed in the intermediate layer. Then, a part of the lower layer of resin (hereinafter also referred to as "organic layer") exposed through the pattern of the intermediate layer is dry-etched so that a pattern is formed in the organic layer. Finally, a pattern is formed on the substrate by dry-etching a part of the substrate exposed through the pattern of the organic layer. In the multilayer resist process, a plurality of intermediate layers may be provided and may be dry-etched separately.

Patent Documents 2 and 3 disclose the use of a silicon-containing layer as an intermediate layer in a multilayer resist process. In particular, Patent Document 2 discloses a silicon-containing layer using $SiO_2$, and Patent Document 3 discloses a silicon-containing layer using SiON. Patent Documents 2 and 3 further disclose Examples each directed to the formation of a pattern on a substrate with the use of such a silicon-containing layer through the steps of patterning the resist layer by light exposure and development according to lithography, patterning the silicon-containing intermediate layer by dry-etching with a plasma of fluorine-based gas through the pattern of the resist layer, and then, patterning the lower layer of novolac resin (organic layer) by dry etching with a plasma of oxygen-based gas through the pattern of the silicon-containing layer.

In order to obtain a fine pattern during the dry etching of the intermediate layer or lower layer, it is required that the intermediate layer shows a high etching rate against the plasma of fluorine-based gas and a low etching rate against the plasma of oxygen-based gas. Herein, the ratio between the rate of etching by the fluorine-based gas and the rate of etching by the oxygen-based gas is referred to as etching selectivity in the present specification. The higher the etching rate ratio, the higher the etching selectivity.

Patent Document 1 also discloses a thermosetting composition for forming a silicon-containing layer which is usable as an intermediate layer in a multilayer resist process and capable of showing a high etching rate against a plasma of fluorine-based gas and a low etching rate against a plasma of oxygen-based gas and thereby achieving a high etching selectivity Further, Patent Document 3 describes that, in the case where a pattern is formed in the resist layer by lithography using the multilayer resist process, a standing wave occurs during the light exposure due to the interference between an incident light and a reflected light generated by reflection of the incident light from the intermediate layer, organic layer or substrate and causes roughness (pits and projections) of the resist pattern.

When the intermediate layer is equipped an anti-reflective function, it is possible to prevent the occurrence of a standing wave and thereby form a fine resist pattern without roughness. For this reason, there has been a demand to provide an intermediate layer which is different in etching rate from the resist layer and shows a high etching rate against a fluorine-based gas while being equipped with an anti-reflective function.

Patent Document 4 discloses, as an intermediate layer with an anti-reflective function for use in a multilayer resist process, a silicon-containing intermediate layer having a light-absorbing aromatic structure.

Patent Document 5 discloses a polysiloxane polymer containing a hexafluoroisopropanol group (2-hydroxy-1,1,1,3,3,3-hexafluoroisopropyl group; —C(CF$_3$)$_2$OH; hereinafter also referred to as "HFIP group") and having good solubility in an alkaline developer and high heat resistance, and a HFIP group-containing silicon compound as a precursor of the polysiloxane polymer.

Furthermore, Patent Document 6 discloses a positive photosensitive resin composition that includes at least a polysiloxane compound having the following structure in its molecule, a photoacid generator or quinone diazide and a solvent, and describes that a film formed from the positive photosensitive resin composition combines heat resistance with heat-resistant transparency.

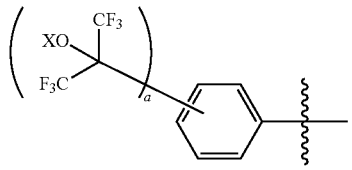

In the above structure, X is each independently a hydrogen atom or an acid-labile group; a is an integer of 1 to 5; and a wavy line means that a line which the wave line intersects is a bond.

PRIOR ART DOCUMENTS

Patent Documents

Patent Document 1: Japanese Laid-Open Patent Publication No. 2012-53253
Patent Document 2: Japanese Laid-Open Patent Publication No. H7-183194
Patent Document 3: Japanese Laid-Open Patent Publication No. H7-181688
Patent Document 4: Japanese Laid-Open Patent Publication No. 2005-15779
Patent Document 5: Japanese Laid-Open Patent Publication No. 2014-156461
Patent Document 6: Japanese Laid-Open Patent Publication No. 2015-129908

SUMMARY OF THE INVENTION

Problems to be Solved by the Invention

The present invention has been made in view of the above circumstances.

It is an object of the present invention to provide a silicon-containing layer forming composition for forming a silicon-containing layer which is capable of, in lithography using a multilayer resist process, showing a high etching rate against a plasma of fluorine-based gas and a low etching rate against a plasma of oxygen-based gas during dry etching after the formation of a resist pattern in an upper resist layer and thereby achieving a high etching selectivity.

It is also an object of the present invention to provide a silicon-containing layer forming composition for forming a silicon-containing layer with an anti-reflective function as an intermediate layer which is, in lithography using a multilayer resist process, useful for the formation of a fine pattern in an upper resist layer.

Means for Solving the Problems

In the case where a silicon compound is used for an intermediate layer in a multilayer resist process, the intermediate layer is equipped with an anti-reflective function by the introduction of an aromatic structure into the silicon compound (see Patent Document 4). The present inventors have however confirmed that, when preparing a silicon-containing layer forming composition including a silicon compound with an aromatic ring and forming a film of the composition on a substrate, the thus-formed film shows a lower etching rate against a plasma of fluorine-based gas than a desired rate and cannot achieve a high etching selectivity between the rate of etching by a plasma of the fluorine-based gas and the rate of etching by a plasma of oxygen-based gas as an intermediate layer in a multilayer resist process (see Comparative Example 1 of TABLE 1 (in the after-mentioned Example section)).

As a result of extensive researches, the present inventor have surprisingly found that, when preparing a silicon-containing layer forming composition including a polysiloxane compound with a HFIP group-introduced aromatic ring and forming a film of the composition on a substrate, the thus-formed film shows a higher etching rate against a plasma of fluorine-based gas than and an equivalent etching rate against a plasma of oxygen-based gas to those of a film using a polysiloxane compound with a HFIP group-free aromatic ring and achieves a high etching selectivity as an intermediate layer in a multilayer resist process (see Examples 1-3 and Comparative Example 1 of TABLE 1 (in the after-mentioned Example section)). In the present invention, the polysiloxane compound refers to a polymer compound with a siloxane bond.

Accordingly, the present invention includes the following inventive aspects 1 to 10.

[Inventive Aspect 1]

A silicon-containing layer forming composition for forming a silicon-containing layer as an intermediate layer of a multilayer film on a substrate, comprising a polysiloxane compound (A) having a structural unit of the formula (1); and a solvent (B)

$$[(R^1)_b R^2_m SiO_{n/2}] \tag{1}$$

where $R^1$ is a group represented by the following formula:

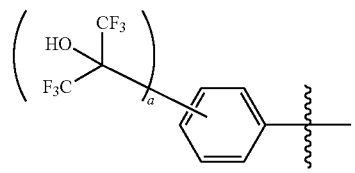

where a is an integer of 1 to 5; and a wavy line means that a line which the wavy line intersects is a bond;
$R^2$ is each independently a hydrogen atom, a $C_1$-$C_3$ alkyl group, a phenyl group, a hydroxy group, a $C_1$-$C_3$ alkoxy group or a $C_1$-$C_3$ fluoroalkyl group; b is an integer of 1 to 3;

m is an integer of 0 to 2; n is an integer of 1 to 3; and a relationship of b+m+n=4 is satisfied.

[Inventive Aspect 2]

The silicon-containing layer forming composition according to Inventive Aspect 1, wherein a is 1 or 2.

[Inventive Aspect 3]

The silicon-containing layer forming composition according to Inventive Aspect 1 or 2, wherein $R^1$ is any of groups represented by the following formulas

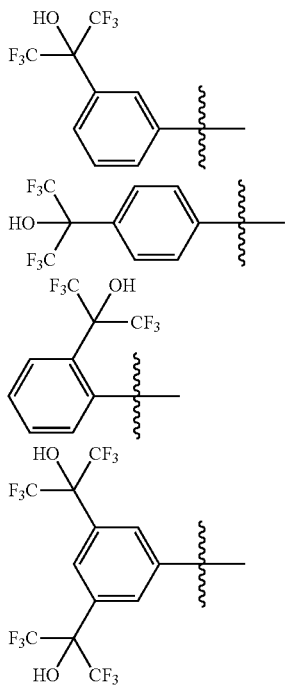

where each wavy line means that a line which the wavy line intersects is a bond.

[Inventive Aspect 4]

The silicon-containing layer forming composition according to any one of Inventive Aspects 1 to 3, wherein b is 1.

[Inventive Aspect 5]

The silicon-containing layer forming composition according to any one of Inventive Aspects 1 to 4, wherein n is 1 to 3.

[Inventive Aspect 6]

The silicon-containing layer forming composition according to any one of Inventive Aspects 1 to 5, wherein the polysiloxane compound (A) has a structural unit of the formula (2)

$$[Si(R^4)_p O_{q/2}] \quad (2)$$

where $R^4$ is each independently a hydrogen atom, a $C_1$-$C_3$ alkyl group, a phenyl group, a $C_1$-$C_3$ alkoxy group or a $C_1$-$C_3$ fluoroalkyl group; p is an integer of 0 to 3; q is an integer of 1 to 4; and a relationship of p+q=4 is satisfied

[Inventive Aspect 7]

A substrate unit, comprising: a substrate; and a three-layer film arranged on the substrate, the three-layer film comprising: an organic layer formed on the substrate; a silicon-containing intermediate layer formed using the silicon-containing layer forming composition according to any one of Inventive Aspects 1 to 6 on the organic layer; and a resist layer formed on the silicon-containing intermediate layer.

[Inventive Aspect 8]

A patterned substrate production method, comprising:

a first step of providing the substrate unit according to Inventive Aspect 7, exposing the resist layer to a high energy ray through a photomask and developing the exposed resist layer with an alkaline aqueous solution to form a pattern in the resist layer;

a second step of dry-etching the silicon-containing intermediate layer through the pattern of the resist layer, thereby forming a pattern in the silicon-containing intermediate layer;

a third step of dry-etching the organic layer through the pattern of the silicon-containing intermediate layer, thereby forming a pattern in the organic layer; and a fourth step of dry-etching the substrate through the pattern of the organic layer, thereby patterning the substrate.

[Inventive Aspect 9]

The patterned substrate production method according to Inventive Aspect 8, wherein, in the second step, the silicon-containing intermediate layer is dry-etched with a fluorine-based gas;

wherein, in the third step, the organic layer is dry-etched with an oxygen-based gas; and wherein, in the fourth step, the substrate is dry-etched with a fluorine-based gas or a chlorine-based gas.

[Inventive Aspect 10]

The patterned substrate production method according to Inventive Aspect 8, wherein the high energy ray is an ultraviolet light having a wavelength of 10 nm to 400 nm.

Effects of the Invention

As mentioned above, the silicon-containing layer forming composition according to the present invention contains the polysiloxane compound in which a HFIP group(s) has been introduced to an aromatic ring, and thus can form a silicon-containing layer that, during dry etching in a multilayer resist process, shows a high etching rate against a plasma of fluorine-based gas and a low etching rate against a plasma of oxygen-based gas and achieves a high etching selectivity.

Further, the silicon-containing layer forming composition according to the present invention contains the polysiloxane compound which includes an aromatic ring in its structure, and thus can form a silicon-containing intermediate layer with an anti-reflective function for the formation of a fine pattern in an upper resist layer in lithography using a multilayer resist process.

DETAILED DESCRIPTION OF THE EMBODIMENTS

Hereinafter, the silicon-containing layer forming composition according to the present invention and the patterned substrate production method using the silicon-containing layer forming composition will be described in detail below.

1. Silicon-Containing Layer Forming Composition

The silicon-containing layer forming composition according to the present invention includes a polysiloxane compound (A) having a structural unit of the formula (1) (hereinafter also referred to as "structural unit (1)") and a solvent (B).

$$[(R^1)_b R^2_m SiO_{n/2}] \quad (1)$$

In the formula (1), $R^1$ is a group represented by the following formula.

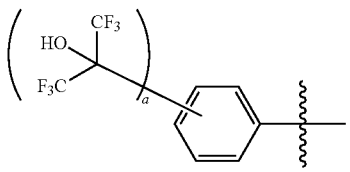

In the above formula, a is an integer of 1 to 5; and a wavy line means that a line which the wavy line intersects is a bond.

Further, $R^2$ is each independently a hydrogen atom, a $C_1$-$C_3$ alkyl group, a phenyl group, a hydroxy group, a $C_1$-$C_3$ alkoxy group or a $C_1$-$C_3$ fluoroalkyl group; b is an integer of 1 to 3; m is an integer of 0 to 2; n is an integer of 1 to 3; and a relationship of b+m+n=4 is satisfied.

[Polysiloxane Compound (A)]

In the structural unit (1) of the polysiloxane compound (A), $R^1$ is preferably any of groups represented by the following formulas.

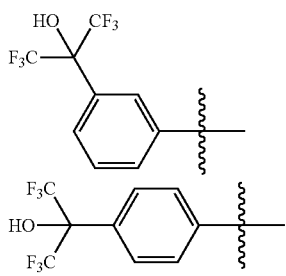

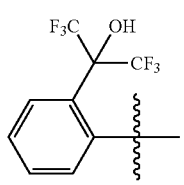

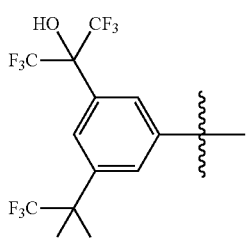

In the above formulas, each wavy line means that a line which the wavy line intersects is a bond.

The polysiloxane compound (A) can be obtained by hydrolysis and polycondensation of a HFIP group-containing aromatic alkoxysilane of the following formula (3) (hereinafter also referred to as "HFIP group-containing aromatic alkoxysilane (3)"), a HFIP group-containing aromatic halosilane of the following formula (4) (hereinafter also referred to as "HFIP group-containing aromatic halosilane (4)") or a mixture thereof.

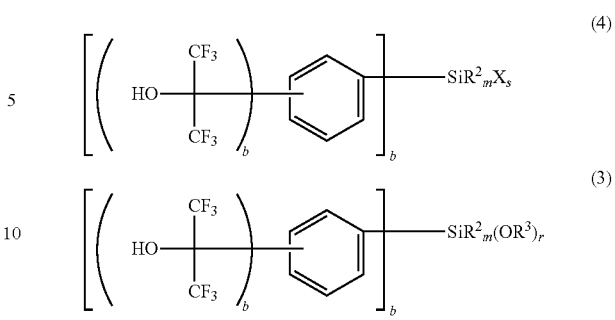

In the formulas (3) and (4), $R^2$ is each independently a hydrogen atom, a $C_1$-$C_3$ alkyl group, a phenyl group, a hydroxy group, a $C_1$-$C_3$ alkoxy group or a $C_1$-$C_3$ fluoroalkyl group; X is a halogen atom; a is an integer of 1 to 5; b is an integer of 1 to 3; m is an integer of 0 to 2; s is an integer of 1 to 3; r is an integer of 1 to 3; and a relationship of b+m+s=4 or b+m+r=4 is satisfied.

1-1. Synthesis of HFIP Group-Containing Aromatic Halosilane (4)

An explanation will be now given of a process for synthesizing the HFIP group-containing aromatic halosilane (4) using an aromatic halosilane (5) as a raw material. The HFIP group-containing aromatic halosilane (4) is obtained by e.g. charging and mixing the aromatic halosilane (5) and a Lewis acid catalyst in a reaction container, introducing hexafluoroacetone into the reaction container to perform the following reaction, and then, subjecting the resulting reaction mixture to distillation purification etc.

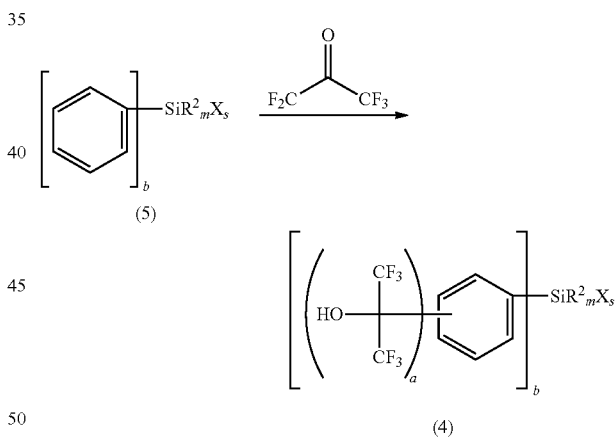

In the reaction scheme, $R^2$ is each independently a hydrogen atom, a $C_1$-$C_3$ alkyl group, a phenyl group, a hydroxy group, a $C_1$-$C_3$ alkoxy group or a $C_1$-$C_3$ fluoroalkyl group; X is a halogen atom; a is an integer of 1 to 5; b is an integer of 1 to 3; m is an integer of 0 to 2; s is an integer of 1 to 3; and a relationship of b+m+s=4 is satisfied.

[Aromatic Halosilane (5)]

The aromatic halosilane (5) used as the raw material has a structure in which a phenyl group and a halogen atom are directly bonded to a silicon atom.

The aromatic halosilane (5) may have a substituent group $R^2$ directly bonded to the silicon atom. As the substituent group $R^2$, there can be used a $C_1$-$C_3$ alkyl group, a phenyl group, a hydroxy group, a $C_1$-$C_3$ alkoxy group or a $C_1$-$C_3$ fluoroalkyl group. Specific examples of the substituent group $R^2$ are methyl, ethyl, propyl, butyl, isobutyl, t-butyl, neopentyl, octyl, cyclohexyl, trifluoromethyl, 1,1,1-trifluoropropyl, perfluorohexyl, perfluorooctyl and the like. Among others, methyl is preferred as the substituent group $R^2$ in terms of the availability of the aromatic halosilane.

Specific examples of the halogen atom X of the aromatic halosilane (5) are fluorine, chlorine, bromine and iodine. Among others, chlorine is preferred as the halogen atom X in terms of the availability and stability of the aromatic halosilane.

The following are preferable examples of the aromatic halosilane (5).

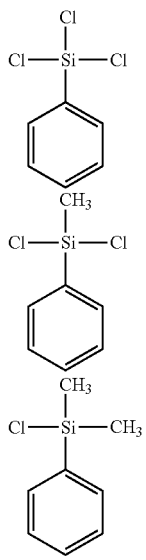

[Lewis Acid Catalyst]

There is no particular limitation on the kind of the Lewis acid catalyst used in this reaction process. Specific examples of the Lewis acid catalyst are aluminum chloride, iron (III) chloride, zinc chloride, tin (II) chloride, titanium tetrachloride, aluminum bromide, boron trifluoride, boron trifluoride-diethyl ether complex, antimony fluoride, zeolites, composite oxides and the like. Among others, aluminum chloride, iron (III) chloride and boron trifluoride are preferred. More preferred is aluminum chloride because it shows high reactivity in the reaction. There is no particular limitation on the amount of the Lewis acid catalyst used. It is preferable to use the Lewis acid catalyst in an amount of 0.01 mol to 1.0 mol per 1 mol of the aromatic halosilane (5).

[Organic Solvent]

In the case where the aromatic halosilane (5) as the raw material is liquid, the reaction can be performed without specifically using an organic solvent. In the case where the aromatic halosilane (5) as the raw material is solid or is high in reactivity, by contrast, an organic solvent can be used in the reaction. There is no particular limitation on the kind of the organic solvent as long as the organic solvent is capable of dissolving therein the aromatic halosilane (5) and does not react with the Lewis acid catalyst and the hexafluoroacetone. Specific examples of the organic solvent are pentane, hexane, heptane, octane, acetonitrile, nitromethane, chlorobenzene, nitrobenzene and the like. These solvents can be used solely or in the form of a mixture thereof.

[Hexafluoroacetone]

The hexafluoroacetone used in this reaction process can be hexafluoroacetone or a hydrate thereof such as hexafluoroacetone trihydrate. In view of the fact that the yield of the reaction becomes lowered due to the entry of water in the reaction system, it is preferable to use the hexafluoroacetone in gaseous form. The amount of the hexafluoroacetone used varies depending on the number of HFIP groups introduced to the aromatic ring. Preferably, the amount of the hexafluoroacetone used is 1 to 6 molar equivalents per 1 mol of the phenyl group contained in the aromatic halosilane (5) as the raw material. In the case of introducing three or more HFIP groups to the phenyl group, it is necessary to use an excessive amount of the hexafluoroacetone and a large amount of the catalyst and to take a long reaction time. Thus, the amount of the hexafluoroacetone used is more preferably 2.5 molar equivalents or less per 1 mol of the phenyl group contained in the aromatic halosilane (5) as the raw material so that the number of HFIP groups introduced to the phenyl group is limited to 2 or less.

[Reaction Conditions]

Herein, the boiling point of the hexafluoroacetone is −28° C. It is thus preferable to use a cooling device or a closed reactor in order for the hexafluoroacetone to remain in the reaction system during the synthesis of the HFIP group-containing aromatic halosilane (4). Particularly preferably used is a closed reactor. In the case where the reaction is preformed using a closed reactor (such as autoclave), it is preferable to first place the aromatic halosilane (5) and the Lewis acid catalyst in the closed reactor and then introduce the hexafluoroacetone gas into the closed reactor such that the pressure inside the closed reactor does not exceed 0.5 MPa.

The suitable reaction temperature in this reaction process largely varies depending on the kind of the aromatic halosilane (5) used as the raw material. It is preferable that the reaction temperature is in the range of −20° C. to 80° C. The reaction is preferably performed at a lower temperature as the raw material has a higher electron density on the aromatic ring and shows a higher electrophilicity. The yield of the HFIP group-containing aromatic halosilane (4) is improved by performing the reaction at as low a temperature as possible and thereby suppressing cleavage of a Ph-Si bond of the aromatic halosilane during the reaction.

There is no particular limitation on the reaction time in this reaction process. The reaction time is set as appropriate depending on the amount of the HFIP group introduced, the temperature, the amount of the catalyst used etc. In order for the reaction to proceed sufficiently, it is preferable to continue the reaction for 1 to 24 hours after the introduction of the hexafluoroacetone.

Further, it is preferable to end the reaction after confirming that the raw material has been sufficiently consumed by general-purpose analytical means such as gas chromatography. After the completion of the reaction, the HFIP group-containing aromatic halosilane (4) is obtained by removing the Lewis acid catalyst through purification operation such as filtration, extraction, distillation etc.

1-2. HFIP Group-Containing Aromatic Halosilane (4)

The HFIP group-containing aromatic halosilane (4) has a structure in which a HFIP group and a silicon atom are directly bonded to an aromatic ring.

The HFIP group-containing aromatic halosilane (4) is obtained in the form of a mixture of a plurality of isomers with different substitution numbers and positions of HFIP groups. The kinds and existence ratio of the isomers with different substitution numbers and positions of HFIP groups vary depending on the structure of the aromatic halosilane (5) used as the raw material and the molar equivalent amount of the hexafluoroacetones reacted. The main isomer has any of the following partial structures.

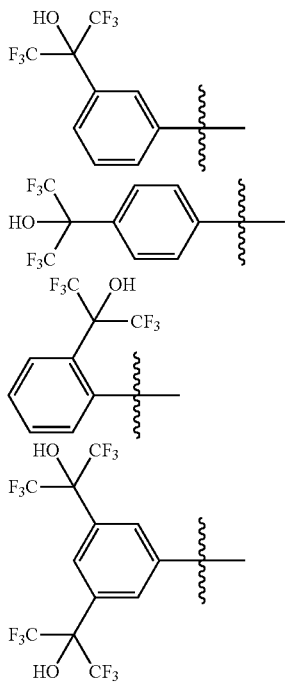

1-3. Synthesis of HFIP Group-Containing Aromatic Alkoxysilane (3)

Next, an explanation will be given of a process for synthesizing the HFIP group-containing aromatic alkoxysilane (3) using the HFIP group-containing aromatic halosilane (4) as a raw material. The HFIP group-containing aromatic alkoxysilane (3) is obtained by e.g. placing and mixing the HFIP group-containing aromatic halosilane (4) and an alcohol (represented by $R^3OH$ as shown below) in a reaction container, performing the following halosilane-to-alkoxysilane conversion reaction, and then, subjecting the resulting reaction mixture to distillation purification etc.

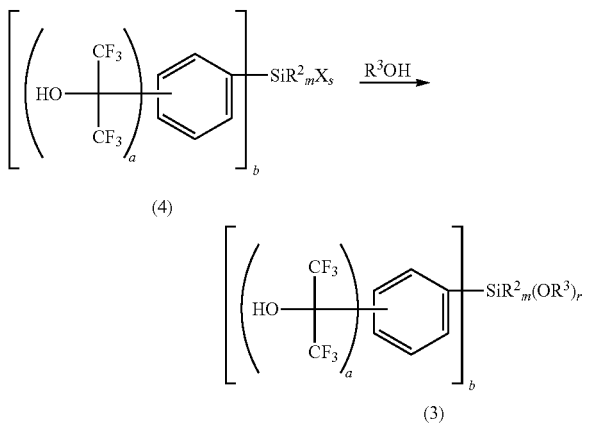

In the reaction scheme, the definitions of $R^2$, $R^3$, X, a, b, m, s and r are the same as mentioned above; and a relationship of $b+m+s=4$ or $b+m+r=4$ is satisfied.

As the raw material, there can be used any kind of isomer separated by precision distillation etc. of the isomer mixture of the HFIP group-containing aromatic halosilane (4). Alternatively, the isomer mixture of the HFIP group-containing aromatic halosilane (4) can be used, as it is without separation operation, as the raw material.

[Alcohol]

The alcohol is appropriately selected depending on the target alkoxysilane. In the alcohol, $R^3$ is preferably a $C_1$-$C_4$ linear or $C_3$-$C_4$ branched alkyl group in which a part or all of hydrogen atoms may be substituted with a fluorine atom. Specific examples of the alcohol are methanol, ethanol, 1-propanol, 2-propanol, 2-fluoroethanol, 2,2,2-trifluoroethanol, 3-fluoropropanol, 3,3-difluoropropanol, 3,3,3-trifluoropropanol, 2,2,3,3-tetrafluoropropanol, 2,2,3,3,3-pentafluoropropanol, 1,1,1,3,3,3-hexafluoroisopropanol and the like. Among others, methanol or ethanol is preferred. When water is contained in the alcohol during the reaction of the alcohol with the HFIP group-containing aromatic halosilane (4), hydrolysis or polycondensation of the HFIP group-containing aromatic halosilane (4) proceeds so that the yield of the target HFIP group-containing aromatic alkoxysilane (3) becomes lowered. It is thus preferable that the alcohol is low in water content. The water content of the alcohol is preferably 5 wt % or less, more preferably 1 wt % or less.

[Reaction Conditions]

There is no particular limitation on the reaction technique for synthesis of the HFIP group-containing aromatic alkoxysilane (43). As a typical example, it is feasible to perform the reaction by dropping the alcohol into the HFIP group-containing aromatic halosilane (4) or by dropping the HFIP group-containing aromatic halosilane (4) into the alcohol.

There is no particular limitation on the amount of the alcohol used. In order for the reaction to proceed efficiently, the amount of the alcohol used is preferably 1 to 10 molar equivalents, more preferably 1 to 3 molar equivalents, per Si—X bond contained in the HFIP group-containing aromatic halosilane (4).

There is also no particular limitation on the dropping time of the alcohol or the HFIP group-containing aromatic halosilane (4). The dropping time is preferably 10 minutes to 24 hours, more preferably 30 minutes to 6 hours. The suitable reaction temperature during the dropping varies depending on the reaction conditions. More specifically, the reaction temperature during the dropping is preferably 0° C. to 70° C.

The reaction can be finished by aging with continuous stirring after the completion of the dropping. There is no particular limitation on the aging time. The aging time is preferably 30 minutes to 6 hours in order for the desired reaction to proceed sufficiently. The reaction temperature during the aging is preferably equal to or higher than the reaction temperature during the dropping. More specifically, the reaction temperature during the aging is preferably 10° C. to 80° C.

Since the reactivity between the alcohol and the HFIP group-containing aromatic halosilane (4) is high, a halogenosilyl group of the halosilane is promptly converted to an alkoxysilyl group during the reaction. In order to promote the reaction and suppress side reactions, it is preferable to remove a hydrogen halide generated during the reaction. One conceivable technique of removing the hydrogen halide is to add a known hydrogen halide scavenger such as amine compound, orthoester, sodium alkoxide, epoxy compound, olefin etc. Another conceivable technique is to remove the generated hydrogen halide gas from the reaction system by heating or bubbling with dry nitrogen gas. These techniques can be used solely or in combination of a plurality thereof.

As the hydrogen halide scavenger, there can suitably be used an orthoester or a sodium alkoxide. Specific examples of the orthoester are trimethyl orthoformate, triethyl orthoformate, tripropyl orthoformate, triisopropyl orthoformate, trimethyl orthoacetate, triethyl orthoacetate, trimethyl orthopropionate, trimethyl orthobenzoate and the like. In terms of the availability, preferred is trimethyl orthoformate or triethyl orthoformate. Specific examples of the sodium alkoxide are sodium methoxide, sodium ethoxide and the like.

During the reaction of the alcohol and the HFIP group-containing aromatic halosilane (4), the reaction system may be diluted with a solvent. There is no particular limitation on the kind of the diluent solvent used as long as the diluent solvent does not react with the alcohol and with the HFIP group-containing aromatic halo silane (4). Specific examples of the diluent solvent are pentane, hexane, heptane, octane, toluene, xylene, tetrahydrofuran, diethyl ether, dibutyl ether, diisopropyl ether, 1,2-dimethoxyethane, 1,4-dioxane and the like. These solvents can be used solely or in the form of a mixture thereof.

Further, it is preferable to end the reaction after confirming that the HFIP group-containing aromatic halosilane (4) as the raw material has been sufficiently consumed by general-purpose analytical means such as gas chromatography. After the completion of the reaction, the HFIP group-containing aromatic alkoxysilane (3) is obtained by purification operation such as filtration, extraction, distillation etc.

Among the HFIP group-containing aromatic alkoxysilane (3), a HFIP group-containing aromatic alkoxysilane of the formula (3-1), which corresponds to the case where b is 1 in the formula (3), can be also obtained by using a HFIP- and Y-substituted benzene and an alkoxyhydrosilane as raw materials and performing coupling reaction of these raw material compounds with the use of a transition metal catalyst such as rhodium, ruthenium or iridium according to a production method disclosed in Patent Document 5.

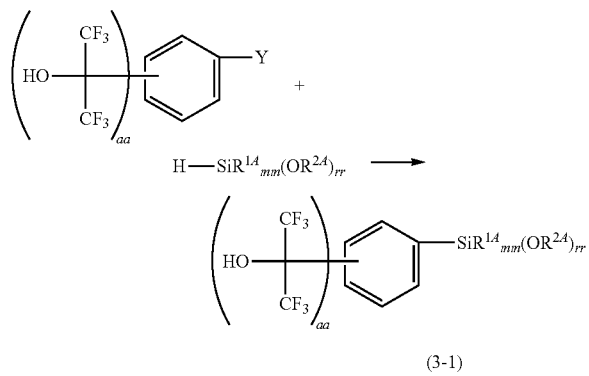

(3-1)

In the reaction scheme, $R^{1A}$ is each independently a hydrogen atom, a $C_1$-$C_3$ alkyl group, a phenyl group, a hydroxy group, a $C_1$-$C_3$ alkoxy group or a $C_1$-$C_3$ fluoroalkyl group; $R^{2A}$ is each independently a $C_1$-$C_4$ linear or $C_3$-$C_4$ branched alkyl group in which a part or all of hydrogen atoms may be substituted with a fluorine atom; Y is a chlorine atom, a bromine atom, an iodine atom, a —$OSO_2$(p-$C_6H_4CH_3$) group or a —$OSO_2CF_3$ group; aa is an integer of 1 to 5; mm is an integer of 0 to 2; rr is an integer of 1 to 3; and a relationship of mm+rr=3 is satisfied.

1-4. Production of Polysiloxane Compound (A)

The polysiloxane compound (A) is produced by hydrolysis and polycondensation of the above-obtained HFIP group-containing aromatic halosilane (4), the above-obtained HFIP group-containing alkoxysilane (3) or a mixture thereof.

The hydrolysis and polycondensation reaction can be performed by a method commonly used for hydrolysis and condensation of hydrolyzable silanes. More specifically, it is feasible to produce the polysiloxane compound (A) through the hydrolysis and polycondensation reaction by placing the HFIP group-containing aromatic halosilane (4), the HFIP group-containing alkoxysilane (3) or a mixture thereof in a reaction container, adding water for the hydrolysis and optionally a catalyst for the polycondensation and a reaction solvent into the reaction container, and then, stirring the contents of the reaction container while heating as needed.

<Catalyst>

There is no particular limitation on the catalyst used for the polycondensation. An acid catalyst or base catalyst can suitably be used. Specific examples of the acid catalyst are hydrochloric acid, nitric acid, sulfuric acid, hydrofluoric acid, phosphoric acid, acetic acid, trifluoroacetic acid, methanesulfonic acid, trifluoromethanesulfonic acid, camphorsulfonic acid, benzenesulfonic acid, tosylic acid, formic acid, polycarboxylic acid, anhydrides thereof and the like. Specific examples of the base catalyst are triethylamine, tripropylamine, tributylamine, tripentylamine, trihexylamine, triheptylamine, trioctylamine, diethylamine, triethanolamine, diethanolamine, sodium hydroxide, potassium hydroxide, sodium carbonate and the like.

<Reaction Solvent>

In the hydrolysis and polycondensation reaction, the reaction solvent is not necessarily used. The hydrolysis and polycondensation reaction can be performed by mixing the raw material, water and catalyst together. In the case of using the reaction solvent, there is no particular limitation on the kind of the reaction solvent used. The reaction solvent is preferably a polar solvent, more preferably an alcohol solvent, in terms of the solubility of the raw material, water and catalyst in the reaction solvent. Specific examples of the reaction solvent are methanol, ethanol, 1-propanol, 2-propanol, 1-butanol, 2-butanol and the like.

1-5. Structural Unit (2)

The polysiloxane compound (A) contained in the silicon-containing layer forming composition according to the present invention may have a structural unit of the formula (2) (hereinafter also referred to as "structural unit (2)").

$$[Si(R^4)_pO_{q/2}] \quad (2)$$

In the formula (2), $R^4$ is each independently a hydrogen atom, a $C_1$-$C_3$ alkyl group, a phenyl group, a $C_1$-$C_3$ alkoxy group or a $C_1$-$C_3$ fluoroalkyl group; p is an integer of 0 to 3; q is an integer of 1 to 4; and a relationship of p+q=4 is satisfied.

In the production of the polysiloxane compound (A), a chlorosilane, alkoxysilane or silicate oligomer which constitutes the structural unit (2) may be added as a raw material of the polysiloxane compound (A) and copolymerized with the HFIP group-containing aromatic halosilane (4) and/or HFIP group-containing aromatic alkoxysilane (3).

[Chlorosilane]

Specific examples of the chlorosilane are dimethyldichlorosilane, diethyldichlorosilane, dipropyldichlorosilane, diphenyldichlorosilane, bis(3,3,3-trifluoropropyl)dichlorosilane, methyl(3,3,3-trifluoropropyl)dichlorosilane, methyltrichlorosilane, ethyltrichlorosilane, propyltrichlorosilane, isopropyltrichlorosilane, phenyltrichlorosilane, trifluoromethyltrichlorosilane, pentafluoroethyltrichlorosilane, 3,3,3-trifluoropropyltrichlorosilane and tetrachlorosilane.

[Alkoxysilane]

Specific examples of the alkoxysilane are dimethyldimethoxysilane, dimethyldiethoxysilane, dimethyldipropoxysilane, dimethyldiphenoxysilane, diethyldimethoxysilane, diethyldiethoxysilane, diethyldipropoxysilane, diethyldiphenoxysilane, dipropyldimethoxysilane, dipropyldiethoxysilane, diphenyldimethoxysilane, diphenyldiethoxysilane, diphenyldiphenoxysilane, bis(3,3,3-trifluoropropyl)dimethoxysilane, methyl(3,3,3-trifluoropropyl)dimethoxysilane, methyltrimethoxysilane, ethyltrimethoxysilane, propyltrimethoxysilane, isopropyltrimethoxysilane, phenyltrimethoxysilane, methyltriethoxysilane, ethyltriethoxysilane, propyltriethoxysilane, isopropyltriethoxysilane, phenyltriethoxysilane, methyltripropoxysilane, ethyltripropoxysilane, propyltripropoxysilane, isopropyltripropoxysilane, phenyltripropoxysilane, methyltriisopropoxysilane, ethyltriisopropoxysilane, propyltriisopropoxysilane, isopropyltriisopropoxysilane, phenyltriisopropoxysilane, trifluoromethyltrimethoxysilane, pentafluoroethyltrimethoxysilane, 3,3,3-trifluoropropyltrimethoxysilane, 3,3,3-trifluoropropyltriethoxysilane, tetramethoxysilane, tetraethoxysilane, tetrapropoxysilane and tetraisopropoxysilane.

[Silicate Oligomer]

The silicate oligomer refers to an oligomer obtained by hydrolysis and polycondensation of a tetraalkoxysilane. Specific examples of the silicate oligomer are commercially available products such as Silicate 40 (pentamer on average; manufactured by Tama Chemicals Co., Ltd.), Ethyl Silicate 40 (pentamer on average; manufactured by Colcoat Co., Ltd.), Silicate 45 (heptamer on average; manufactured by Tama Chemicals Co., Ltd.), M-Silicate 51 (tetramer on average; manufactured by Tama Chemicals Co., Ltd.), Methyl Silicate 51 (tetramer on average; manufactured by Colcoat Co., Ltd.), Methyl Silicate 53A (heptamer on average; manufactured by Colcoat Co., Ltd.), Ethyl Silicate 48 (decamer on average; manufactured by Colcoat Co., Ltd.) and EMS-485 (mixture of ethyl silicate and methyl silicate; manufactured by Colcoat Co., Ltd.).

1-6. Solvent (B)

In the silicon-containing layer forming composition according to the present invention, the solvent (B) is used in addition to the polysiloxane compound (A). The solvent (B) can be of any kind capable of dissolving or dispersing therein the polysiloxane compound (A) without causing deposition. There can suitably be used an ester solvent, an ether solvent, an alcohol solvent, a ketone solvent or an amide solvent.

[Ester Solvent]

Examples of the ester solvent are acetic ester, basic ester and cyclic ester. The acetic ester can be exemplified by propylene glycol monomethyl ether acetate (also referred to as "PGMEA"). The basic ester can be exemplified by ethyl lactate. The cyclic ester can be exemplified by γ-butyrolactone.

[Ether Solvent]

Examples of the ether solvent are butanediol monomethyl ether, propylene glycol monomethyl ether, ethylene glycol monomethyl ether, butanediol monoethyl ether, propylene glycol monoethyl ether, ethylene glycol monoethyl ether, butanediol monopropyl ether and propylene glycol monopropyl ether.

[Alcohol Solvent]

Examples of the alcohol solvent are glycols such as ethylene glycol, diethylene glycol, triethylene glycol, propylene glycol, dipropylene glycol, butanediol and pentanediol.

[Ketone Solvent]

Examples of the ketone solvent are cyclic solvents such as cyclohexanone.

[Amide Solvent]

Examples of the amide solvent are N,N-dimethylformamide, N,N-dimethylacetamide and N-methylpyrrolidone.

In the present invention, it is preferable to use propylene glycol monomethyl ether acetate (PGMEA) as the solvent (B) in the silicon-containing layer forming composition because propylene glycol monomethyl ether acetate is commonly used in the semiconductor industry.

The amount of the solvent (B) contained in the silicon-containing layer forming composition is generally 200 to 100000 parts by mass, preferably 400 to 50000 parts by mass, per 100 parts by mass of the polysiloxane compound (A). When the amount of the solvent (B) contained is less than 200 parts by mass, the polysiloxane compound (A) may be deposited. When the amount of the solvent (B) contained exceeds 100000 parts by mass, the silicon-containing layer forming composition may be too dilute so that it is not easy to form an intermediate layer from the silicon-containing layer forming composition.

1-7. Other Component

In the present invention, any other component may be contained as needed as a constituent component of the silicon-containing layer forming composition in addition to the polysiloxane compound (A) and the solvent (B). As the other component, there can be used a surfactant, a silane coupling agent or the like. Two or more kinds of the other components may be contained.

As the constituent component of the silicon-containing layer forming composition, the surfactant is expected to exert a deforming and leveling effect during film formation; and the silane coupling agent is expected to provide an improvement in the adhesion to an upper resist layer and a lower organic layer.

[Surfactant]

The surfactant is preferably a nonionic surfactant. Examples of the surfactant are perfluoroalkyl polyoxyethylene ethanol, fluorinated alkyl ester, perfluoroalkyl amine oxide and fluorine-containing organosiloxane.

[Silane Coupling Agent]

Examples of the silane coupling agent are methyltrimethoxysilane, methyltriethoxysilane, dimethyldimethoxysilane, dimethyldiethoxysilane, ethyltrimethoxysilane, ethyltriethoxysilane, n-propyltrimethoxysilane, n-propyltriethoxysilane, n-butyltrimethoxysilane, n-butyltriethoxysilane, phenyltrimethoxysilane, phenyltriethoxysilane, diphenyldimethoxysilane, diphenyldiethoxysilane, vinyltrimethoxysilane, vinyltriethoxysilane, 3-methacryloxypropyltrimethoxysilane, 3-methacryloxypropyltriethoxysilane, 3-methacryloxypropylmethyldimethoxysilane, 3-methacryloxypropylmethyldiethoxysilane, 3-acryloxypropyltrimethoxysilane, 3-aminopropyltrimethoxysilane, 3-aminopropyltriethoxysilane, 3-triethoxysilyl-N-(1,3-dimethyl-butylidene)propylamine, N-phenyl-3-aminopropyltrimethoxysilane, 3-glycidoxypropyltrimethoxysilane, 3-glycidoxypropyltriethoxysilane, 3-glycidoxypropylmethyldiethoxysilane, 2-(3,4-epoxycyclohexyl)ethyltrimethoxysilane, 2-(3,4-epoxycyclohexyl)ethyltriethoxysilane, [(3-ethyl-3-oxetanyl)methoxy]propyltrimethoxysilane, [(3-ethyl-3-oxetanyl)methoxy]propyltriethoxysilane, 3-mercaptopropyltrimethoxysilane, 3-mercaptopropylmethyldimethoxysilane, 3-ureidopropyltriethoxysilane, 3-isocyanatepropyltriethoxysilane, 3-trimethoxysilylpropylsuccinic acid and N-tert-butyl-3-(3-trimethoxysilylpropyl)succinimide.

The silicon-containing layer forming composition according to the present invention is also applicable as the resist layer in the multilayer resist process. The silicon-containing layer forming composition according to the present invention, when applied as a resist layer, further contains additional components such as a photoacid generator capable of generating an acid by light exposure, a basic substance for suppressing diffusion of the acid, a quinone diazide compound capable of forming an indene-carboxylic acid by light exposure and a cross-linking agent capable of reacting the base polymer under the action of the acid. With the addition of such additional components, the silicon-containing layer forming composition exhibits the function of a resist. The thus-obtained resist layer is used in combination with the organic layer. According to lithography, a pattern is formed by light exposure in the resist layer using the silicon-containing layer forming composition according to the present invention. Subsequently, the organic layer is patterned by dry etching with a plasma of oxygen-based gas through the pattern of the resist layer. The substrate is then dry-etched with a plasma of fluorine-based gas or chlorine-based gas through the patterned organic layer, whereby the substrate with the desired pattern is obtained.

2. Patterned Substrate Production Method Using Silicon-Containing Layer Forming Composition In a multilayer resist process, a multilayer film having a resist layer (upper layer), an intermediate layer and an organic layer (lower layer) is applied to a substrate so that a patterned substrate is produced by forming a pattern in the resist layer according to lithography, dry-etching the intermediate layer and the organic layer with the use of the thus-formed resist pattern as a mask and finally transferring the pattern to the substrate. The silicon-containing layer forming composition according to the present invention is applicable as the intermediate layer.

In other words, the patterned substrate production method according to the present invention includes the following steps:

a first step of providing a multilayer film-equipped substrate which has a three-layer film including: an organic layer; a silicon-containing intermediate layer formed using a cured product of the silicon-containing layer forming composition on the organic layer; and a resist layer formed on the silicon-containing intermediate layer, exposing the resist layer to a high energy ray through a photomask and developing the resist layer with an alkaline aqueous solution to form a pattern in the resist layer;

a second step of dry-etching the silicon-containing intermediate layer through the pattern of the resist layer, thereby forming a pattern in the silicon-containing intermediate layer;

a third step of dry-etching the organic layer through the pattern of the silicon-containing intermediate layer, thereby forming a pattern in the organic layer; and a fourth step of dry-etching the substrate through the pattern of the organic layer, thereby forming a pattern on the substrate.

It is preferable that, in the second step, the silicon-containing intermediate layer is dry-etched with a fluorine-based gas. It is also preferable that, in the third step, the organic layer is dry-etched with an oxygen-based gas. Further, it is preferable that, in the fourth step, the substrate is dry-etched with a fluorine-based gas or chlorine-based gas.

The respective elements will be explained in detail below.

[Substrate]

Examples of the substrate material are: plates made of silicon, amorphous silicon, polycrystalline silicon, silicon oxide, silicon nitride, silicon oxynitride etc.; those obtained by forming metal films such as tungsten film, tungsten-silicon film, aluminum film, copper film etc. on the aforementioned plates; those obtained by forming low dielectric films or insulating films on the aforementioned plates. The film formed on the plate is generally 50 nm to 20000 nm in thickness.

The multilayer film-equipped substrate is obtained by forming the organic layer (as a lower layer) on the substrate material, forming the intermediate layer using the silicon-containing layer forming composition on the organic layer and then forming the resist layer (as an upper layer) on the intermediate layer.

[Organic Layer (Lower Layer)]

As the organic layer, a layer of novolac resin or polyimide resin having a bisphenol structure or fluorene structure is formed on the substrate. The organic layer can be formed by e.g. spin-coating an organic layer forming composition containing such a resin. The organic layer has an aromatic ring in its structure and thus exhibits not only an anti-reflective function during the exposure of the resist layer for the formation of the pattern in the resist layer, but also sufficient resistance to etching by a plasma of fluorine-based gas during the subsequent dry etching of the intermediate layer with the fluorine-based gas through the pattern of the resist layer. The thickness of the organic layer varies depending on the etching conditions during the dry etching step. The thickness of the organic layer is not particularly limited and is generally in the range of 5 nm to 20000 nm.

[Intermediate Layer]

The intermediate layer is formed on the organic layer by e.g. spin-coating the silicon-containing layer forming composition according to the present invention. After the formation of the intermediate layer, it is preferable to cure the intermediate layer by heating at 100° C. to 400° C. in order to prevent mixing between the organic layer (lower layer) and the intermediate layer. The thickness of the intermediate layer varies depending on the kind of the fluorine-based gas etc. used in the dry etching gas and the etching conditions during the dry etching step. The thickness of the intermediate layer is not particularly limited and is generally in the range of 5 nm to 200 nm.

The intermediate layer, formed using the silicon-containing layer forming composition according to the present invention, has an aromatic ring in its structure and thus exhibits a sufficient anti-reflective function during the light exposure of the resist layer so as to form a pattern in the resist layer while suppressing roughness of the pattern. Further, the intermediate layer has a HFIP group whose hydroxy moiety makes a contribution to the adhesion to the patterned resist layer so that, even when the pattern is fine or high in aspect ratio, the pattern is made less likely to collapse.

[Resist Layer (Upper Layer)]

The resist layer is formed on the intermediate layer by e.g. spin-coating a resist composition, whereby the multilayer film is completed. The thus-formed resist layer is patterned by exposing the resist layer to the high energy ray, such as g-ray, i-ray, ultraviolet light from e.g. KrF excimer laser or ArF excimer layer or EUV through the photomask and making the exposed part of the resist layer soluble in the developer solution (in the case of positive resist) or insoluble in the developer solution (in the case of negative resist). In the case of positive resist, tetramethylammoniumhydroxide is ordinarily used as the developer. The resist composition is of any type capable of forming a resist layer having sensitivity to the high energy ray and can be selected as appropriate depending on the wavelength of the high energy ray. In the patterned substrate production method according to the present invention, the high energy ray is preferably an ultraviolet light having a wavelength of 10 to 400 nm.

As the resist composition, there can be used a known resist prepared by mixing a resist base resin with a photoacid generator capable of generating an acid by light exposure and a basic substance for suppressing diffusion of the acid.

Examples of the base resin are polymethacrylate, copolymer of cyclic olefin and maleic anhydride, polynorbornene, polyhydroxystyrene, novolac resin, phenol resin, maleimide resin, polyimide, polybenzoxazole, polysiloxane and polysilsesquioxane.

Examples of the photoacid generator are quinone diazide compounds each capable of forming an indene-carboxylic acid by light exposure. In the case of negative resist, an additive such as a cross-linking agent capable of reacting with the base resin under the action of the acid is added to the resist.

[Pattern Formation]

A part of the intermediate layer is exposed to the outside through a part of the patterned resist layer which has been removed by dissolution in the developer solution. This exposed part of the intermediate layer is dry-etched with a plasma of fluorine-based gas such as fluorocarbon gas etc. During the dry etching, the intermediate layer formed from the silicon-containing layer forming composition according to the present invention shows a high etching rate against the plasma of fluorine-based gas; whereas the patterned resist layer shows a low etching rate against the plasma of fluorine-based gas. This makes it possible to achieve a sufficient etching selectivity between the intermediate layer and the patterned resist layer.

Consequently, the intermediate layer is patterned using the pattern of the resist layer as a mask.

The organic layer is subsequently patterned by dry etching using a plasma of oxygen-based gas as an etching gas and using the patterned intermediate layer as a mask. In this way, the pattern transferred to the organic layer is obtained.

Finally, the substrate is dry-etched with a plasma of fluorine-based gas or chlorine-based gas through the pattern of the organic layer. As a result, the substrate with the desired pattern is obtained.

[Etching Gas]

In the patterned substrate production method, a gas of fluorine-substituted hydrocarbon is usable as the fluorine-based gas. Examples of the fluorine-based gas are $CF_4$ and $CHF_3$. Examples of the oxygen-based gas are $O_2$, CO and $CO_2$. In terms of the safety, $O_2$, CO and $CO_2$ are preferably usable.

EXAMPLES

The present invention will be described in more detail below by way of the following examples. It should however be understood that the present invention is not limited to the following examples.

The analysis of polysiloxane compounds obtained in the following respective examples was conducted by the following methods.

[Nuclear Magnetic Resonance (NMR)]

The $^1$H-NMR and $^{19}$F-NMR spectra of the polysiloxane compound were measured using a nuclear magnetic resonance apparatus (JNM-ECA400 manufactured by JEOL Ltd.) with a resonance frequency of 400 MHz.

[Gas Chromatography (GC)]

The polysiloxane compound was identified using a gas chromatograph manufactured as Shimadzu GC-2010 by Shimadzu Corporation with a capillary column DB1 (length: 60 mm, inner diameter: 0.25 mm, film thickness: 1 µm) manufactured by Agilent Ltd.

[Gel Permeation Chromatography (GPC)]

The weight-average molecular weight of the polysiloxane compound in terms styrene was measured using a gel permeation chromatography system manufactured as HLC-8320GPC by Tosoh Corporation.

1. Synthesis of Polysiloxane Compounds

Synthesis of 3-(2-Hydroxy-1,1,1,3,3,3-Hexafluoroisopropyl)-Trichlorosilylbenzene Into a 300-mL autoclave with a stirrer, 126.92 g (600 mmol) of phenyltrichlorosilane and 8.00 g (60.0 mmol) of aluminum chloride were charged. The inside of the autoclave was replaced with nitrogen, followed by raising the temperature inside the autoclave to 40° C. Then, 119.81 g (722 mmol) of hexafluoroacetone were gradually charged into the autoclave over 2 hours. The resulting reaction liquid was kept stirred for 3 hours. After the completion of the reaction, solid matter was removed from the reaction liquid by pressure filtration. Subsequently, the reaction liquid was subjected to precision distillation, thereby obtaining 146.01 g of 3-(2-hydroxy-1,1,1,3,3,3-hexafluoroisopropyl)-trichlorosilylbenzene (with a yield of 64.8% and a GC purity of 98%) as a colorless liquid. The reaction scheme of this reaction is shown below.

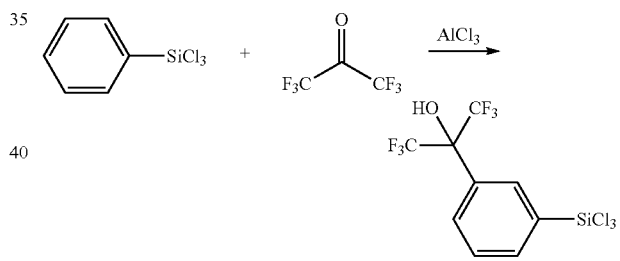

The $^1$H-NMR and $^{19}$F-NMR measurements of the obtained 3-(2-hydroxy-1,1,1,3,3,3-hexafluoroisopropyl)-trichlorosilylbenzene were carried out. The measurement results are shown below.

$^1$H-NMR (solvent: $CDCl_3$, TMS): δ 8.17 (s, 1H), 7.96-7.89 (m, 2H), 7.64-7.60 (dd, J=7.8 Hz, 1H), 3.42 (s, 1H)

$^{19}$F-NMR (solvent: $CDCl_3$, $CCl_3F$): δ−75.44 (s, 12F)

Synthesis of 3-(2-Hydroxy-1,1,1,3,3,3-Hexafluoroisopropyl)-Triethoxysilylbenzene Provided was a 1-L four-neck flask with a thermometer, a mechanical stirrer and a Dimroth reflux tube. The inside of the flask was replaced with nitrogen. Then, 47.70 g (1035 mmol) of anhydrous ethanol, 81.00 g (801 mmol) of triethylamine and 300 g of toluene were charged into the flask at room temperature (25° C.). The mixed liquid inside the flask was cooled to 0° C. with stirring. Subsequently, 100.00 g of 3-(2-hydroxy-1,1,1,3,3,3-hexafluoroisopropyl)-trichlorosilylbenzene was gradually dropped into the flask over 1 hour. During the dropping, the flask was cooled in an ice bath so that the liquid temperature was controlled to 15° C. or lower.

After the dropping, the resulting reaction liquid was heated to room temperature and kept stirred for 30 minutes. The reaction liquid was subjected to suction filtration, followed by transferring the reaction liquid into a separatory funnel and washing the organic layer three times with 300 g of water. The toluene was removed from the organic layer by means of a rotary evaporator, thereby obtaining 49.49 g of 3-(2-hydroxy-1,1,1,3,3,3-hexafluoroisopropyl)-triethoxysilylbenzene (with a GC purity of 97%) as a colorless transparent liquid. The yield of the 3-(2-hydroxy-1,1,1,3,3,3-hexafluoroisopropyl)-triethoxysilylbenzene with reference to phenyltrichlorosilane was 39%. The reaction scheme of this reaction is shown below.

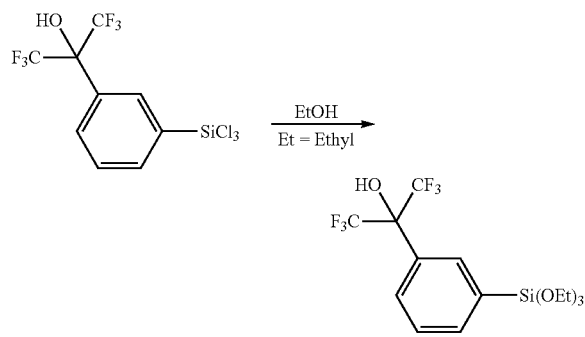

The $^1$H-NMR and $^{19}$F-NMR measurements of the obtained 3-(2-hydroxy-1,1,1,3,3,3-hexafluoroisopropyl)-triethoxysilylbenzene were carried out. The measurement results are shown below.

$^1$H-NMR (solvent: CDCl$_3$, TMS): δ 8.00 (s, 1H), 7.79-7.76 (m, 2H), 7.47 (t, J=7.8 Hz, 1H), 3.87 (q, J=6.9 Hz, 6H), 3.61 (s, 1H), 1.23 (t, J=7.2 Hz, 9H)

$^{19}$F-NMR (solvent: CDCl$_3$, CCl$_3$F): δ−75.99 (s, 6F)

Example 1 (Production of Polysiloxane Compound (1))

Into a 50-mL flask, 8.1 g (20 mmol) of the above-obtained 3-(2-hydroxy-1,1,1,3,3,3-hexafluoroisopropyl)-triethoxysilylbenzene, 1.08 g (60 mmol) of water and 0.06 g (1 mmol) of acetic acid were charged. The resulting reaction mixture was stirred at 100° C. for 24 hours. After the stirring, toluene was added into the flask. The reaction mixture was then refluxed by a Dean-Stark device, with the bottom of the flask put in a heated bath of 150° C., to remove the water, acetic acid and by-produced ethanol. Subsequently, the toluene was removed under vacuum by means of a rotary evaporator. As a result, there was obtained 16.15 g of a polysiloxane compound (1) as a white solid. The weight-average molecular weight of the polysiloxane compound was measured by the GPC system and found to be Mw=1650. The reaction scheme of this reaction is shown below.

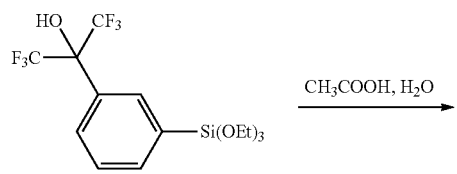

-continued

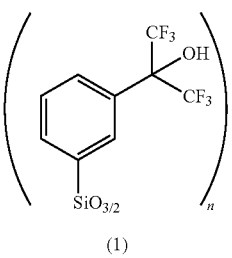

(1)

Example 2 (Production of Polysiloxane Compound (2))

Into a 50-mL flask, 7.6 g (20 mmol) of the above-obtained 3-(2-hydroxy-1,1,1,3,3,3-hexafluoroisopropyl)-trichlorosilylbenzene was charged. While the flask was cooled in an ice bath, 1.08 g (60 mmol) of water was dropped into the flask. The resulting reaction mixture was stirred at room temperature for 1 hour. After the completion of the reaction, residual water and hydrogen chloride were removed under vacuum from the reaction mixture. As a result, there was obtained 5.13 g of a polysiloxane compound (2) as a white solid. The weight-average molecular weight of the polysiloxane compound was measured by the GPC system and found to be Mw=5151. The reaction scheme of this reaction is shown below.

Example 3 (Production of Polysiloxane Compound (3))

Into a 50-mL flask, 4.06 g (10 mmol) of the above-obtained 3-(2-hydroxy-1,1,1,3,3,3-hexafluoroisopropyl)-triethoxysilylbenzene, 2.40 g (10 mmol) of phenyltriethoxysilane, 1.08 g (60 mmol) of water and 0.06 g (1 mmol) of acetic acid were charged. The resulting reaction mixture was heated to 100° C. and stirred for 24 hours. After the stirring, toluene was added to the reaction mixture inside the flask. The reaction mixture was then refluxed by a Dean-Stark device, with the bottom of the flask put in a heated bath of 150° C., to remove the water, acetic acid and by-produced ethanol. Subsequently, the toluene was removed under vacuum by means of a rotary evaporator. As a result, there was obtained 3.92 g of a polysiloxane compound (3) as a white solid. The weight-average molecular weight of the polysiloxane compound was measured by the GPC system and found to be Mw=2100. The reaction scheme of this reaction is shown below.

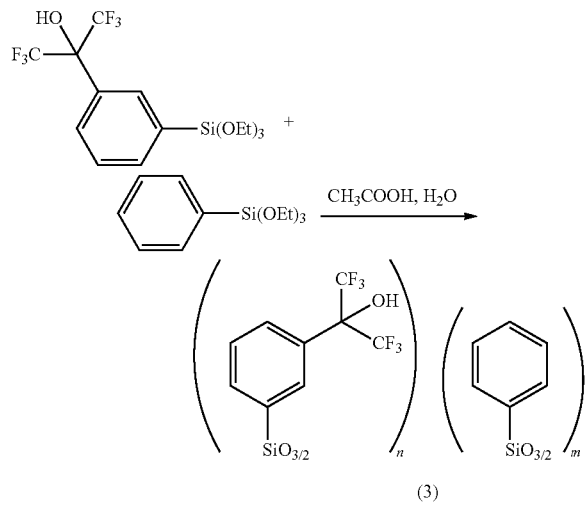

(3)

Example 4 (Production of Polysiloxane Compound (4))

Into a 50-mL flask, 8.13 g (20 mmol) of the above-obtained 3-(2-hydroxy-1,1,1,3,3,3-hexafluoroisopropyl)-tri-ethoxysilylbenzene, 2.98 g (20 mmol) of Silicate 40 (pentamer on average; manufactured by Tama Chemicals Co., Ltd.), 0.97 g (54 mmol) of water and 0.12 g (2 mmol) of acetic acid were charged. The resulting reaction mixture was heated to 40° C. and stirred for 1 hour. Further, the reaction mixture was heated to 70° C. and stirred for 2 hours. After the stirring, the water, acetic acid and by-produced ethanol were removed under vacuum by means of a rotary evaporator. As a result, there was obtained 6.63 g of a polysiloxane compound (4) as a white solid. The weight-average molecular weight of the polysiloxane compound was measured by the GPC system and found to be Mw=1860. The reaction scheme of this reaction is shown below.

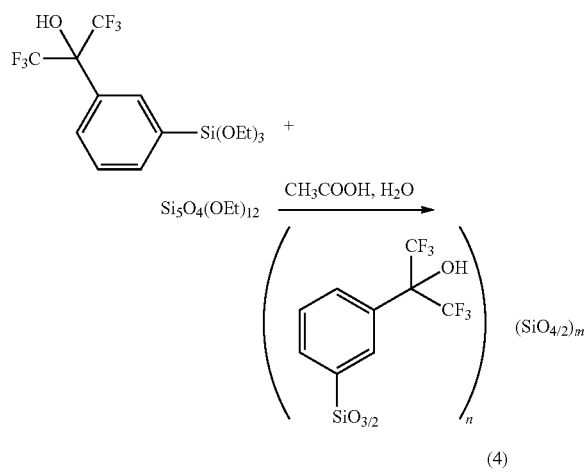

(4)

Comparative Example 1 (Production of Polysiloxane Compound (5))

In a 50-mL flask, 4.80 g (20 mmol) of phenyltriethoxysilane, 1.08 g (60 mmol) of water and 0.06 g (1 mmol) of acetic acid were charged. The resulting reaction mixture was stirred at 100° C. for 24 hours. After the completion of the reaction, toluene was added to the reaction mixture. The reaction mixture was then refluxed by a Dean-Stark device, with the bottom of the flask put in heated bath of 150° C., to remove the water, acetic acid and by-produced ethanol. Subsequently, the toluene was removed under vacuum by means of a rotary evaporator. As a result, there was obtained 3.24 g of a polysiloxane compound (5) as a white solid. The weight-average molecular weight of the polysiloxane compound was measured by the GPC system and found to be Mw=3000. The reaction scheme of this reaction is shown below.

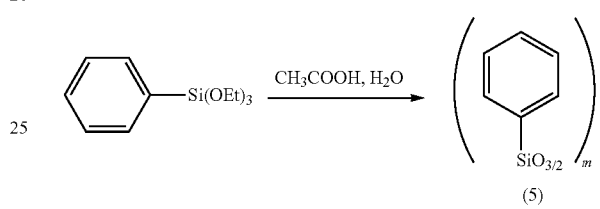

(5)

2. Measurement of Etching Rate and Etching Selectivity

Polysiloxane compound solutions (1) to (5) were prepared by completely dissolving 1 g of each of the polysiloxane compounds (1) to (4) of Examples 1 to 4 and the polysiloxane compound (5) of Comparative Example 1 in 4 g of propylene glycol monomethyl ether acetate and filtering the resulting solution through a filter of pore size 0.22 μm.

The polysiloxane compound solutions (1) to (5) were respectively applied by spin coating at 500 rpm onto silicon wafers of diameter 4 inch (101.6 mm) and thickness 525 μm manufactured by SUMCO corporation. The coated silicon wafers were dried for 1 minute at 90° C. on a hot plate. Then, the coated silicon wafers were heated and baked at 180° C. for 1 hour. There were thus obtained the silicon wafers on which the coating films were respectively formed of the polysiloxane compounds (1) to (5) with a thickness of 1.7 to 2.0 μm.

The silicon wafers with the coating films of the polysiloxane compounds (1) to (5) was subjected to dry etching with a fluorine-based gas ($CF_4$ and $CHF_3$) and with an oxygen-based gas ($CO_2$ or $O_2$). The etching rates of the coating films by the respective gases was measured. The etching selectivity of the coating films was determined based on the etching rate measurement results. The etching conditions (1) to (3) are shown below. (Hereinafter, the etching rate is occasionally simply referred to as "rate"; and the etching conditions are occasionally simply referred to as "conditions".)

[Conditions (1)] Use of $CF_4$ and $CHF_3$ as Fluorine-Based Gas
Flow rate of $CF_4$: 150 sccm
Flow rate of $CHF_3$: 50 sccm
Flow rate of Ar: 100 sccm
Chamber pressure: 10 Pa
Power applied: 400 W Temperature: 15° C.

[Conditions (2)] Use of CO$_2$ as Oxygen-Based Gas
Flow rate of CO$_2$: 300 sccm
Flow rate of Ar: 100 sccm
Flow rate of N$_2$: 100 sccm
Chamber pressure: 2 Pa
Power applied: 400 W
Temperature: 15° C.

[Conditions (3)] Use of O$_2$ as Oxygen-Based Gas
Flow rate of O$_2$: 400 sccm
Flow rate of Ar: 100 sccm
Chamber pressure: 2 Pa
Power applied: 400 W
Temperature: 15° C.

The etching rate measurement results of the films of the polysiloxane compounds (1) to (4) of Examples 1 to 4 and the polysiloxane compound (5) of Comparative Example 1 on the silicon wafers and a film of a resist for argon fluoride laser, which is usable as an upper resist in a multilayer resist process, under the etching conditions (1) to (3) and the determination results of the etching selectivity of the respective films are shown in TABLE 1. Herein, the etching rate ratio A refers to a measured value of the rate under the conditions (1) divided by a measured value of the rate under the conditions (2); and the etching rate ratio B refers to a measured value of the rate under the conditions (1) divided by a measured value of the rate under the conditions (3).

TABLE 1

| | Polysiloxane compound | Measured etching rate (nm/min) | | | Etching selectivity | |
| | | Conditions (1) CF$_4$ + CHF$_3$ | Conditions (2) CO$_2$ | Conditions (3) O$_2$ | Rate ratio A | Rate ratio B |
|---|---|---|---|---|---|---|
| Ex. 1 | (1) | 79 | 2 | 5 | 39 | 16 |
| Ex. 2 | (2) | 75 | 2 | 5 | 37 | 15 |
| Ex. 3 | (3) | 67 | 2 | 5 | 33 | 13 |
| Ex. 4 | (4) | 91 | 2 | 5 | 46 | 12 |
| Comp. Ex. 1 | (5) | 54 | 2 | 5 | 27 | 10 |
| ArF resist | — | 45 | 171 | 296 | — | — |

Etching rate ratio A: Measured etching rate under conditions (1)/Measured etching rate under conditions (2)
Etching rate ratio B: Measured etching rate under conditions (1)/Measured etching rate under conditions (3)

As shown in TABLE 1, the etching rate ratio A of the HFIP group-containing polysiloxane compounds (1) to (4) of Examples 1 to 4 was 39, 37, 33 and 46, respectively. On the other hand, the etching rate ratio A of the HFIP group-free polysiloxane compound (5) of Comparative Example 1 was 27. It is apparent from these results that each of the polysiloxane compounds (1) to (4) had a higher etching rate ratio and showed a higher etching rate selectivity against the fluorine-based gas and the oxygen-based gas than the polysiloxane compound (5) of Comparative Example 1.

The etching rate ratio B of the polysiloxane compounds (1) to (4) of Examples 1 to 4 was 16, 15, 13 and 18, respectively, as shown in TABLE 1. On the other hand, the etching rate ratio B of the polysiloxane compound (5) of Comparative Example 1 was 10. It is also apparent from these results that each of the polysiloxane compounds (1) to (4) had a higher etching rate ratio and showed higher etching rate selectivity against the fluorine-based gas and the oxygen-based gas than the polysiloxane compound (5) of Comparative Example 1.

As also shown in TABLE 1, the etching rate of the films of the polysiloxane compounds (1) to (4) with the oxygen-based gas under the conditions (2) was 2 nm/min; and the etching rate of the films of the polysiloxane compounds (1) to (4) with the oxygen-based gas under the conditions (3) was 5 nm/min. Further, the etching rate of the ArF resist with the oxygen-based gas under the conditions (2) and (3) were 171 nm/min and 296 nm/min, respectively. It apparent from these results that the films of the polysiloxane compounds (1) to (4) had a higher etching resistance to the oxygen-based gas than that of the ArF resist usable as an upper layer in a multilayer resist process.

The invention claimed is:

1. A patterned substrate production method, comprising:
   a first step of providing a substrate unit which comprises a substrate and a three-layer film arranged on the substrate and having an organic layer formed on the substrate, a silicon-containing intermediate layer on the organic layer and a resist layer formed on the silicon-containing intermediate layer, exposing the resist layer to an energy ray through a photomask and developing the exposed resist layer with an alkaline aqueous solution to form a pattern in the resist layer, wherein the silicon-containing intermediate layer is formed using a silicon-containing layer forming composition which comprises a polysiloxane compound (A) having a structural unit of the formula (1) and a solvent (B)

$$[(R^1)_b R^2_m SiO_{n/2}] \tag{1}$$

where R$^1$ is a group represented by the following formula:

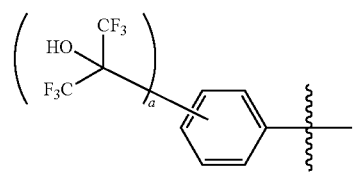

a is an integer of 1 to 5; and a wavy line means that a line which the wavy line intersects is a bond; R$^2$ is each independently a hydrogen atom, a C$_1$-C$_3$ alkyl group, a phenyl group, a hydroxy group, a C$_1$-C$_3$ alkoxy group or a C$_1$-C$_3$ fluoroalkyl group; b is an integer of 1 to 3; m is an integer of 0 to 2; n is an integer of 1 to 3; and a relationship of b+m+n=4 is satisfied;

a second step of dry-etching the silicon-containing intermediate layer through the pattern of the resist layer, thereby forming a pattern in the silicon-containing intermediate layer;

a third step of dry-etching the organic layer through the pattern of the silicon-containing intermediate layer, thereby forming a pattern in the organic layer; and a fourth step of dry-etching the substrate through the pattern of the organic layer, thereby patterning the substrate.

2. The patterned substrate production method according to claim 1,
   wherein, in the second step, the silicon-containing intermediate layer is dry-etched with a fluorine-based gas;
   wherein, in the third step, the organic layer is dry-etched with an oxygen-based gas; and
   wherein, in the fourth step, the substrate is dry-etched with a fluorine-based gas or a chlorine-based gas.

3. The patterned substrate production method according to claim 1, wherein the energy ray is an ultraviolet light having a wavelength of 10 nm to 400 nm.

4. The patterned substrate production method according to claim 1, wherein a in the above formula is 1 or 2.

5. The patterned substrate production method according to claim 1, wherein $R^1$ in the formula (1) is any of groups represented by the following formulas

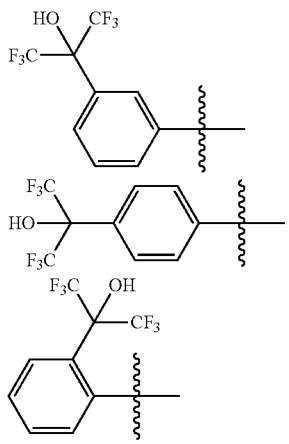

-continued

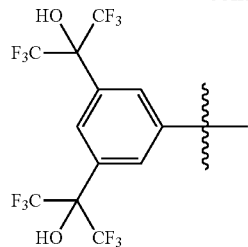

where each wavy line means that a line which the wavy line intersects is a bond.

6. The patterned substrate production method according to claim 1, wherein b in the formula (1) is 1.

7. The patterned substrate production method according to claim 1, wherein n in the formula (1) is 1 to 3.

8. The patterned substrate production method according to claim 1, wherein the polysiloxane compound (A) has, in addition to the structural unit of the formula (1), a structural unit of the formula (2)

$$[Si(R^4)_p O_{q/2}] \qquad (2)$$

where $R^4$ is each independently a hydrogen atom, a $C_1$-$C_3$ alkyl group, a phenyl group, a $C_1$-$C_3$ alkoxy group or a $C_1$-$C_3$ fluoroalkyl group; p is an integer of 0 to 3; q is an integer of 1 to 4; and a relationship of p+q=4 is satisfied.

\* \* \* \* \*